US009099318B2

(12) United States Patent
Chen

(10) Patent No.: US 9,099,318 B2
(45) Date of Patent: Aug. 4, 2015

(54) SEMICONDUCTOR CHIP HAVING DIFFERENT PAD WIDTH TO UBM WIDTH RATIOS AND METHOD OF MANUFACTURING THE SAME

(75) Inventor: Hsien-Wei Chen, Sinying (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 982 days.

(21) Appl. No.: 13/107,678

(22) Filed: May 13, 2011

(65) Prior Publication Data
US 2012/0091578 A1  Apr. 19, 2012

Related U.S. Application Data

(60) Provisional application No. 61/393,487, filed on Oct. 15, 2010.

(51) Int. Cl.
*H01L 23/498* (2006.01)
*H01L 23/00* (2006.01)

(52) U.S. Cl.
CPC .................. *H01L 24/06* (2013.01); *H01L 24/03* (2013.01); *H01L 24/05* (2013.01); *H01L 24/11* (2013.01); *H01L 24/13* (2013.01); *H01L 24/16* (2013.01); *H01L 2224/0345* (2013.01); *H01L 2224/03462* (2013.01); *H01L 2224/03464* (2013.01); *H01L 2224/0401* (2013.01); *H01L 2224/05022* (2013.01); *H01L 2224/05124* (2013.01); *H01L 2224/05147* (2013.01); *H01L 2224/05552* (2013.01); *H01L 2224/05555* (2013.01); *H01L 2224/05572* (2013.01);
(Continued)

(58) Field of Classification Search
CPC .......... H01L 24/03; H01L 24/05; H01L 24/06; H01L 24/11; H01L 24/13; H01L 24/16
USPC .................... 257/784, 780, E23.068, 737, 773
See application file for complete search history.

(56) References Cited

U.S. PATENT DOCUMENTS 5,642,261 A * 6/1997 Bond et al. ..................... 361/704
6,824,041 B2 * 11/2004 Grieder et al. ............ 228/180.22
(Continued)

FOREIGN PATENT DOCUMENTS

CN          101645407         2/2010

OTHER PUBLICATIONS

Office Action dated Mar. 5, 2013 from corresponding application No. CN201110309282.X.

Primary Examiner — Mohammad Islam
Assistant Examiner — John P Dulka
(74) Attorney, Agent, or Firm — Lowe Hauptman & Ham, LLP

(57) ABSTRACT

A semiconductor chip includes a substrate, a circuit formed over the substrate, a plurality of conductive pads formed over the substrate, and a plurality of bump structures each formed over a corresponding one of the plurality of conductive pads. The plurality of conductive pads includes a first conductive pad having a first pad width and a second conductive pad having a second pad width larger than the first pad width. The first conductive pad is electrically coupled to the circuit, and the second conductive pad is positioned at a corner region of the semiconductor chip and is free from being electrically coupled to the circuit. The first conductive pad is positioned closer to a geometric center of the semiconductor chip than the second conductive pad.

20 Claims, 8 Drawing Sheets

(52) U.S. Cl.
CPC ............... *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05666* (2013.01); *H01L 2224/05671* (2013.01); *H01L 2224/0603* (2013.01); *H01L 2224/0613* (2013.01); *H01L 2224/06135* (2013.01); *H01L 2224/06136* (2013.01); *H01L 2224/06179* (2013.01); *H01L 2224/1132* (2013.01); *H01L 2224/1145* (2013.01); *H01L 2224/11462* (2013.01); *H01L 2224/11464* (2013.01); *H01L 2224/11849* (2013.01); *H01L 2224/13007* (2013.01); *H01L 2224/13082* (2013.01); *H01L 2224/13083* (2013.01); *H01L 2224/13111* (2013.01); *H01L 2224/13113* (2013.01); *H01L 2224/13116* (2013.01); *H01L 2224/13139* (2013.01); *H01L 2224/13144* (2013.01); *H01L 2224/13147* (2013.01); *H01L 2224/13155* (2013.01); *H01L 2224/16225* (2013.01); *H01L 2924/00013* (2013.01); *H01L 2924/014* (2013.01); *H01L 2924/0105* (2013.01); *H01L 2924/01013* (2013.01); *H01L 2924/01019* (2013.01); *H01L 2924/01024* (2013.01); *H01L 2924/01029* (2013.01); *H01L 2924/01033* (2013.01); *H01L 2924/01047* (2013.01); *H01L 2924/01074* (2013.01); *H01L 2924/01079* (2013.01); *H01L 2924/01082* (2013.01); *H01L 2924/3512* (2013.01)

(56) References Cited

U.S. PATENT DOCUMENTS

| | | | | |
|---|---|---|---|---|
| 7,514,788 | B2 * | 4/2009 | Kobae et al. | 257/738 |
| 7,973,418 | B2 * | 7/2011 | Alvarado et al. | 257/780 |
| 8,188,606 | B2 * | 5/2012 | Alvarado et al. | 257/780 |
| 8,969,191 | B2 * | 3/2015 | Chen | 438/613 |
| 2005/0230828 | A1 * | 10/2005 | Wu | 257/738 |
| 2011/0018130 | A1 * | 1/2011 | Yamada et al. | 257/737 |
| 2011/0108981 | A1 * | 5/2011 | Rahim et al. | 257/737 |
| 2011/0248398 | A1 * | 10/2011 | Parvarandeh et al. | 257/737 |
| 2013/0270698 | A1 * | 10/2013 | Chen et al. | 257/738 |
| 2013/0320524 | A1 * | 12/2013 | Chuang et al. | 257/737 |
| 2014/0291838 | A1 * | 10/2014 | Chen et al. | 257/737 |
| 2015/0061116 | A1 * | 3/2015 | Lu et al. | 257/737 |

* cited by examiner

SEMICONDUCTOR CHIP HAVING DIFFERENT PAD WIDTH TO UBM WIDTH RATIOS AND METHOD OF MANUFACTURING THE SAME

CROSS-REFERENCE TO RELATED APPLICATIONS

The present application claims priority of U.S. Provisional Patent Application Ser. No. 61/393,487, filed on Oct. 15, 2010, which is incorporated herein by reference in its entirety.

BACKGROUND

When packaging a semiconductor chip after circuitry has been formed thereon, the interconnection between the circuitry on the chip and the input/output connecting pins on a package substrate may be implemented by Flip-Chip packaging technology. A Flip-Chip assembly includes a direct electric connection of a face down (that is, "flipped") semiconductor chip onto a package substrate, such as a ceramic substrate or a circuit board. Flip-Chip technology is quickly replacing older wire bonding technology that uses face up semiconductor chips with the wire connected to each pad on the semiconductor chips.

To package a semiconductor chip using Flip-Chip packaging technology, the semiconductor chip is flipped and positioned on a package substrate. Conductive bumps are reflown to form electric connections therebetween and provide limited mechanical mounting for the semiconductor chip and the package substrate. Then, an underfilling adhesive, such as epoxy, is used to fill spaces between the semiconductor chip and the package substrate in order to provide even better mechanical interconnection between the semiconductor chip and the package substrate.

DESCRIPTION OF THE DRAWINGS

One or more embodiments are illustrated by way of example, and not by limitation, in the figures of the accompanying drawings, wherein elements having the same reference numeral designations represent like elements throughout, and wherein.

DETAILED DESCRIPTION

Figure 1A:
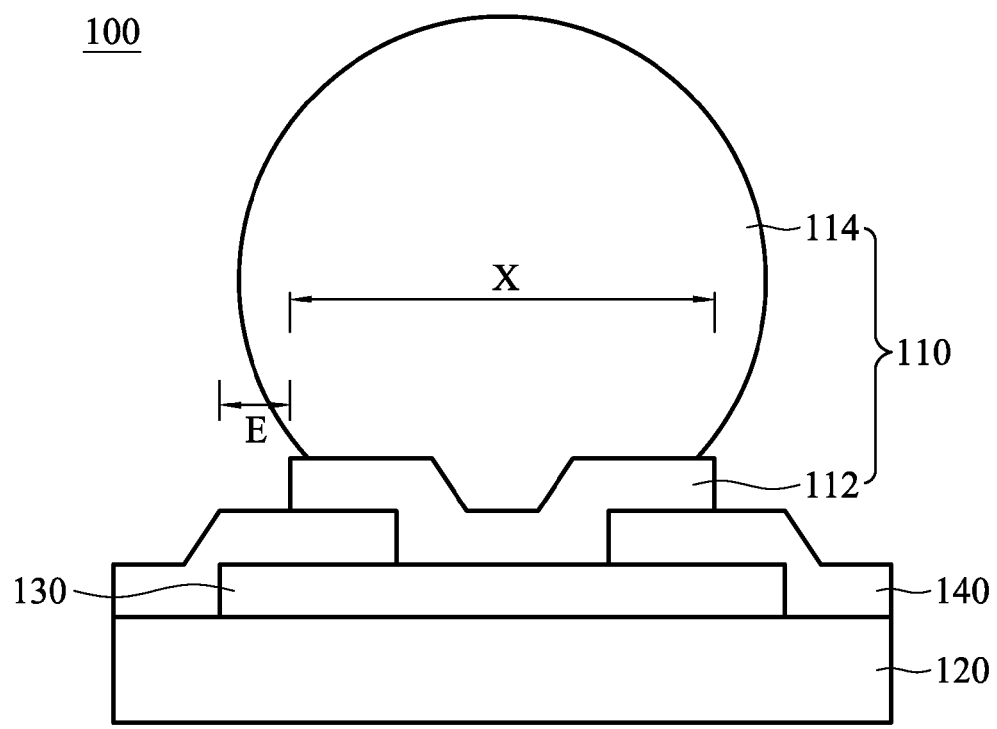
FIG. 1A is a cross-sectional view of a portion of a semiconductor chip having a bump structure formed over a substrate according to an embodiment.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure. Further, for clarity of the disclosure, the features and dimensions in the drawings are not depicted in scale.

In the following description, numerous specific details are set forth to provide a thorough understanding of embodiments of the present disclosure. However, one having an ordinary skill in the art will recognize that embodiments of the disclosure can be practiced without these specific details. In some instances, well-known structures and processes have not been described in detail to avoid unnecessarily obscuring embodiments of the present disclosure.

A substantial amount of stress exists in the solder bumps and filling materials connecting a semiconductor chip to a packaging substrate using Flip-Chip packaging technology. This stress arises in part from coefficient of thermal expansion (CTE) differentials between the semiconductor chip and the packaging substrate. As mentioned, the Flip-Chip packaging technology involves flipping a semiconductor chip onto a package substrate and heating the flipped semiconductor chip. These operations impose a great amount of stress and strain to the semiconductor chip. With increasing utilization of mechanically weaker materials, such as low dielectric constant (low-k) materials, semiconductor chips are more vulnerable to stress and strain than those using non-low-k materials. Further, as semiconductor chip sizes increase, the stress and strain associated with the packaging process also increases.

The stress and strain are particularly significant on bumps located away from a central region of the semiconductor chip, such as at the periphery or the four corners of the semiconductor chip. Over time, the stress may result in mechanical and/or electrical failure due to bump cracks and/or fractures and delamination in the dielectric layers of the semiconductor chip package.

FIG. 1A is a cross-sectional view of a portion of a semiconductor chip 100 having a bump structure 110 formed over a substrate 120 according to an embodiment. The substrate 120 has a circuit formed thereon. Further, the substrate 120 also has a plurality of conductive layers and dielectric layers that form interconnections for the circuit on the substrate.

A conductive pad 130 corresponding in area to the bump structure 110 is formed between the substrate 120 and the bump structure 110. In some embodiments, conductive pad 130 comprises aluminum (Al), copper (Cu), or aluminum/copper alloys. Although only a bump structure 110 and a corresponding conductive pad 130 is depicted in FIG. 1A, a person of ordinary skill in the art will appreciate that there are usually a plurality of bump structures 110 and a plurality of corresponding conductive pads 130 formed over the substrate 120 in the semiconductor chip 100. In at least one embodiment, at least a portion of the conductive pads 130 are electrically coupled to the circuit, and at least another portion of the conductive pads 130 are not electrically coupled to the circuit.

A passivation layer 140 is formed over the substrate 120 and partially over the conductive pad 130. As such, an opening is defined by the passivation layer 140 to expose a portion of the conductive pad 130. In some embodiments, the opening is formed by removing a portion of passivation layer 140 using a photoresist mask in an etching process. In some embodiments, the passivation layer 140 comprises silicon nitride (SiN), silicon dioxide (SiO2), silicon oxynitride (SiON), polyimide, lead oxide (PBO), or other insulating material. Although only one passivation layer 140 is depicted in FIG. 1A, in some embodiments two or more layers of passivation layers are formed over the substrate 120.

The bump structure has an under bump metallurgy (UBM) structure 112 formed over the conductive pad 130 and a solder bump 114 formed over the UBM structure 112. The UBM structure 112 is an intermediate conductive layer electrically connecting the conductive pad 130 and the solder bump 114. In some embodiments, UBM structure 112 is formed by electroless plating, sputtering, or electroplating. In at least one embodiment, UBM structure 112 comprises a multiple layer structure such as adhesion, barrier, and/or wetting layers. In some embodiments, the adhesion layer is made of chromium (Cr), titanium tungsten (TiW), titanium (Ti), or aluminum (Al). In some embodiments, the barrier layer is optional, and is made of nickel (Ni), NiV, CrCu, TiN, or TiW. In some embodiments, the wetting layer is made of Cu, Au, or Ag.

In some embodiments, the solder bump 114 is formed by evaporation, electrolytic plating, electroless plating, and/or screen printing one or more electrically conductive materials over the UBM structure 112. The electrically conductive material for forming the solder bump 114 comprises metal, such as tin (Sn), lead (Pb), Ni, gold (Au), silver (Ag), Cu, bismuthinite (Bi), or alloys thereof, or mixtures of other conductive materials. In at least one embodiment, the solder bump 114 comprises 63 weight-percentage (wt %) of Sn and 37 wt % of Pb. In some embodiments, the solder bump 114 has a spherical shape formed by temporarily heating the conductive material to a temperature above a melting point of the conductive material.

Although the solder bump 114 is formed directly on the UBM structure 112 in FIG. 1A, in some embodiments, one or more additional features are formed between the solder bump 114 and the UBM structure 112, such as a bump post or one or more layers of conductive materials.

Figure 1B:
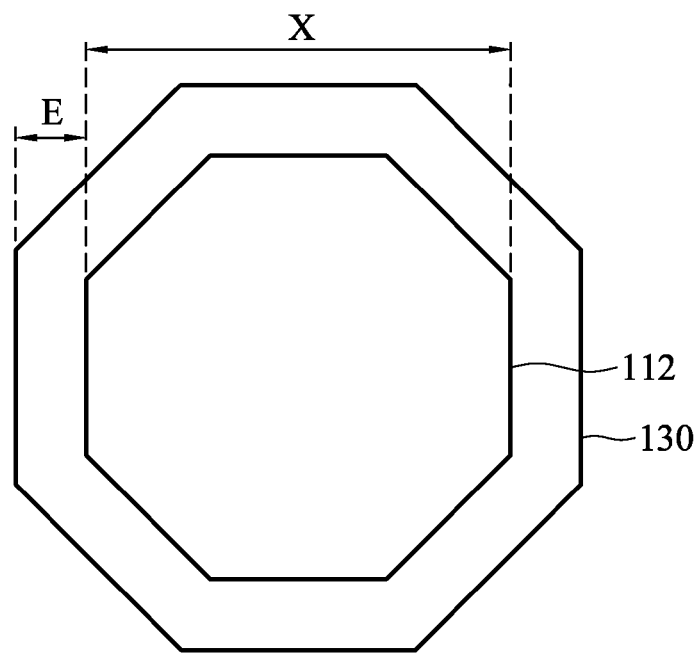
FIG. 1B is a top view of a UBM structure overlaying a conductive pad in the semiconductor chip depicted in FIG. 1A.

FIG. 1B is a top view of the UBM structure 112 overlaying a conductive pad 130 in the semiconductor chip 100 depicted in FIG. 1A. For clarity of the disclosure, other features of the semiconductor chip are omitted in FIG. 1B. The conductive pad 130 has a shape similar to that of the UBM structure 112. Although the UBM structure 112 and the conductive pad 130 depicted in FIG. 1B are octagons, in some embodiments, the UBM structure 112 and the conductive pad 130 are circles, other regular polygons, or any other shapes. Further, in the embodiment depicted in FIGS. 1A and 1B, the UBM structure 112 has a UBM width X. The UBM structure 112 is horizontally positioned in the center of the conductive pad 114, and the UBM structure 112 and the conductive pad 130 define a lateral edge-to-edge distance E. Accordingly, the conductive pad 130 has a pad width equal X+2E. In some embodiments, for a process having UBM width of 85 μm, the lateral edge-to-edge distance E ranges from 1 μm to 12 μm.

Figure 2A:
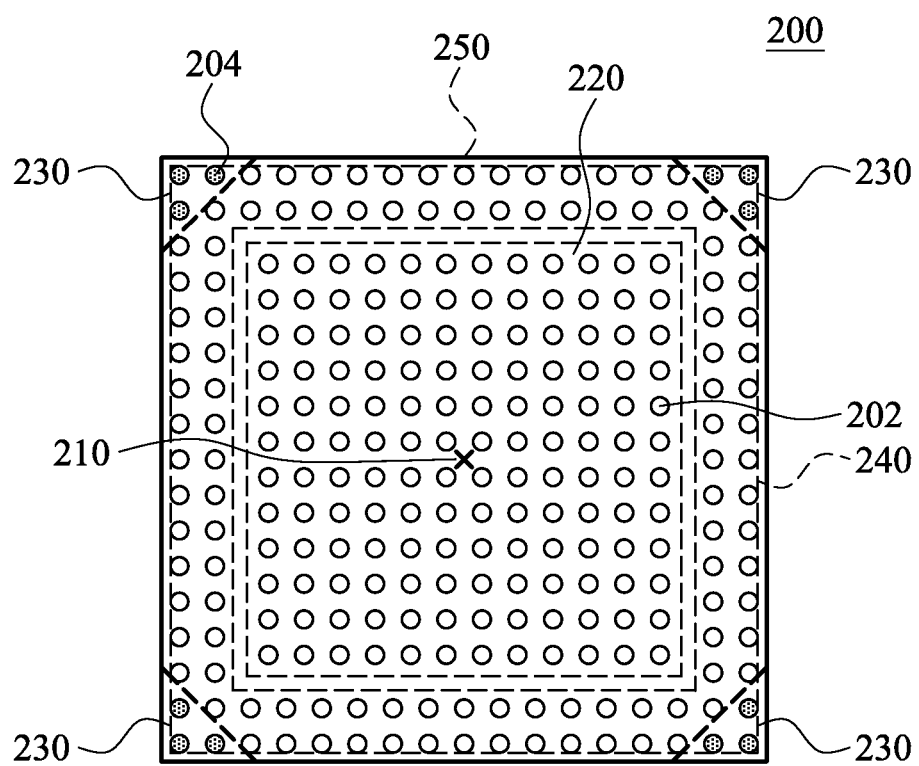
FIG. 2A is a top view of a bump layout for a semiconductor chip according to an embodiment.

FIG. 2A is a top view of a bump layout 200 for a semiconductor chip according to an embodiment. A layout includes layers of patterns for manufacturing a semiconductor chip, such as various layers of patterns for forming semiconductor components on substrates and various layers of patterns for forming conductive pads and/or bump structures. The patterns are generated by layout engineers according to a circuit design of the semiconductor chip, usually through the operation of a layout editing tool or an electronic design automation (EDA) tool. Each pattern corresponds to a mask pattern usable to form at least a feature, such as a well, a drain region, a source region, a gate electrode, a conductive line, or other features over a semiconductor substrate.

In FIG. 2A, the 'X' symbol denotes a geometric center 210 of the semiconductor chip, and each circle denotes a bump position for forming a conductive pad and a bump structure over the conductive pad. Although the bump positions are arranged in a grid-like pattern in FIG. 2A, in some embodiments, the bump positions are arbitrarily positioned. Further, the bump layout 200 for the semiconductor chip has a square shape bump bonding edge 250. However, in some embodiments, the bump layout 200 has a bump bonding edge in different shapes, such as having a rectangular outline or an octagon outline.

The semiconductor chip formed based on the bump layout 200 has a plurality of conductive pads formed over the substrate at the bump positions, and a plurality of bump structures each formed over a corresponding one of the plurality of conductive pads. In the present embodiment, at least a first conductive pad is positioned at a bump position 202 closer to the geometric center 210 than a second conductive pad at a bump position 204, and the second conductive pad has a second pad width larger than a first pad width of the first conductive pad.

In some embodiments, the plurality of conductive pads have pad widths that are progressively increased as the conductive pads are positioned farther from the geometric center 210. In some embodiments, the plurality of conductive pads are arranged into a plurality of groups, and conductive pads within one of the groups have substantially the same pad width.

The conductive pads are arranged into a group corresponding to a central region 220 of the semiconductor chip, a group corresponding to a corner region 230 of the semiconductor chip, and a group corresponding to a peripheral region 240 of the semiconductor chip. In some embodiments, the conductive pads occupying a region father form the geometric center of the semiconductor chip have a larger pad width. For example, in at least one embodiment, the pad width of the group of conductive pads in the peripheral region 240 is greater than that in the central region 220, and the pad width of the group of conductive pads in the corner region 230 is greater than that in the peripheral region 240. Although only three groups of conductive pad are depicted in FIG. 2A, a person of ordinary skill in the art will appreciate that, in some embodiments, the conductive pads are arranged into more or less than three groups.

Figure 2B:
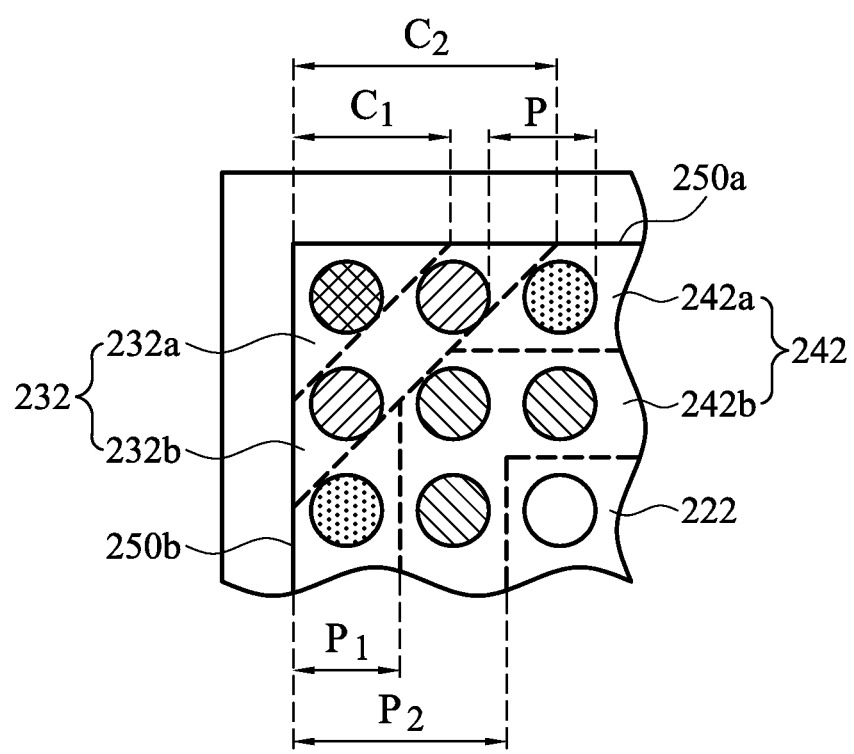
FIGS. 2B-2D are enlarged views of a portion of a bump layout for a semiconductor chip according to some embodiments.

FIG. 2B is a top view of a portion of a bump layout for a semiconductor chip according to some embodiments. The bump positions are grouped according to a central region 222, a corner region 232, and a peripheral region 242. In some embodiments, the corner region 232 is further divided into a first corner region 232a and a second corner region 232b; and the peripheral region 242 is further divided into a first peripheral region 242a and a second peripheral region 242b.

The first corner region 232 is defined by a right triangle region having a leg extending along a first UBM bonding edge 250a and another leg extending along a second UBM bonding edge 250b. The legs have a predetermined leg length C1. The second corner region 232b is defined by the difference of the right triangle region as described above and another right triangle region having a leg extending along the first UBM bonding edge 250a and another leg extending along the second UBM bonding edge 250b with leg length C2. C1 is zero or a positive number, and C2 is a number greater than C1.

In at least one embodiment where the UBM width is X and a pitch between UBM structures is P, the leg length C1 equals 1.707*X, and the leg length C1 equals 1.707*(X+P).

Further, a peripheral region is defined by a rectangular region having a side offset from the second UBM bonding edge 250b for a first distance, such as zero or P1, and a side offset from the second UBM bonding edge 250b for a second distance, such as P1 or P2, subtracting the corner regions 232a and/or 232b. For example, the first peripheral region 242a is defined according to a rectangle region having the first distance equal zero and the second distance equal P1; and the second peripheral region 242b is defined according to a rectangle region, having the first distance equal P1 and the second distance equal P2. P1 and P2 are numbers greater than zero. Although only a portion of the bump layout 200 is illustrated in FIG. 2B, regions in other portions of the bump layout are similarly defined as well.

The region in which the geometric center 210 sits and which is not defined as corner regions 232a/232b or peripheral regions 242a/242b is defined as the central region 222.

Figure 2C:
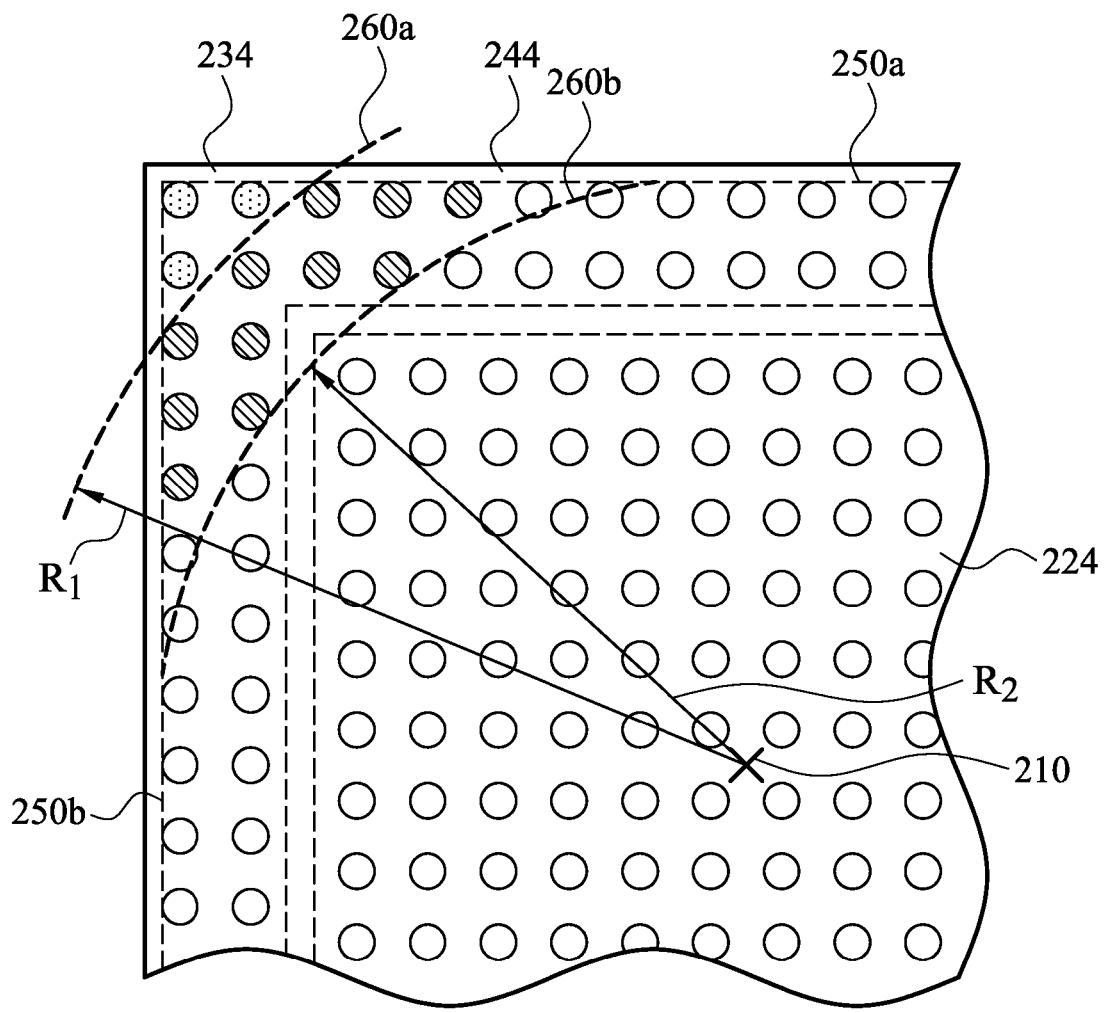

FIG. 2C is a top view of a portion of a bump layout for a semiconductor chip according to some embodiments. The bump positions are grouped according to a central region 224, a corner region 234, and a peripheral region 244.

Various regions are defined by UBM bonding edges 250a/250b or arcs R1/R2. For example, the corner region 234 is defined by a region enclosed by legs extending along UBM bonding edges 250a and 250b, and an arc 260a having a distance R1 to the geometric center 210. The peripheral region 244 is defined as a region between a first arc 260a having a first distance R1 to the geometric center 210 and a second arc 260b having a second distance R2 to the geometric center 210. The region in which the geometric center 210 sits and which is not defined as corner region 234 and peripheral region 244 is defined as the central region 224. In at least one embodiment, the first distance R1 and the second distance R2 are determined based on the maximum distance between the geometric center 210 to different predetermined corner phases.

Figure 2D:
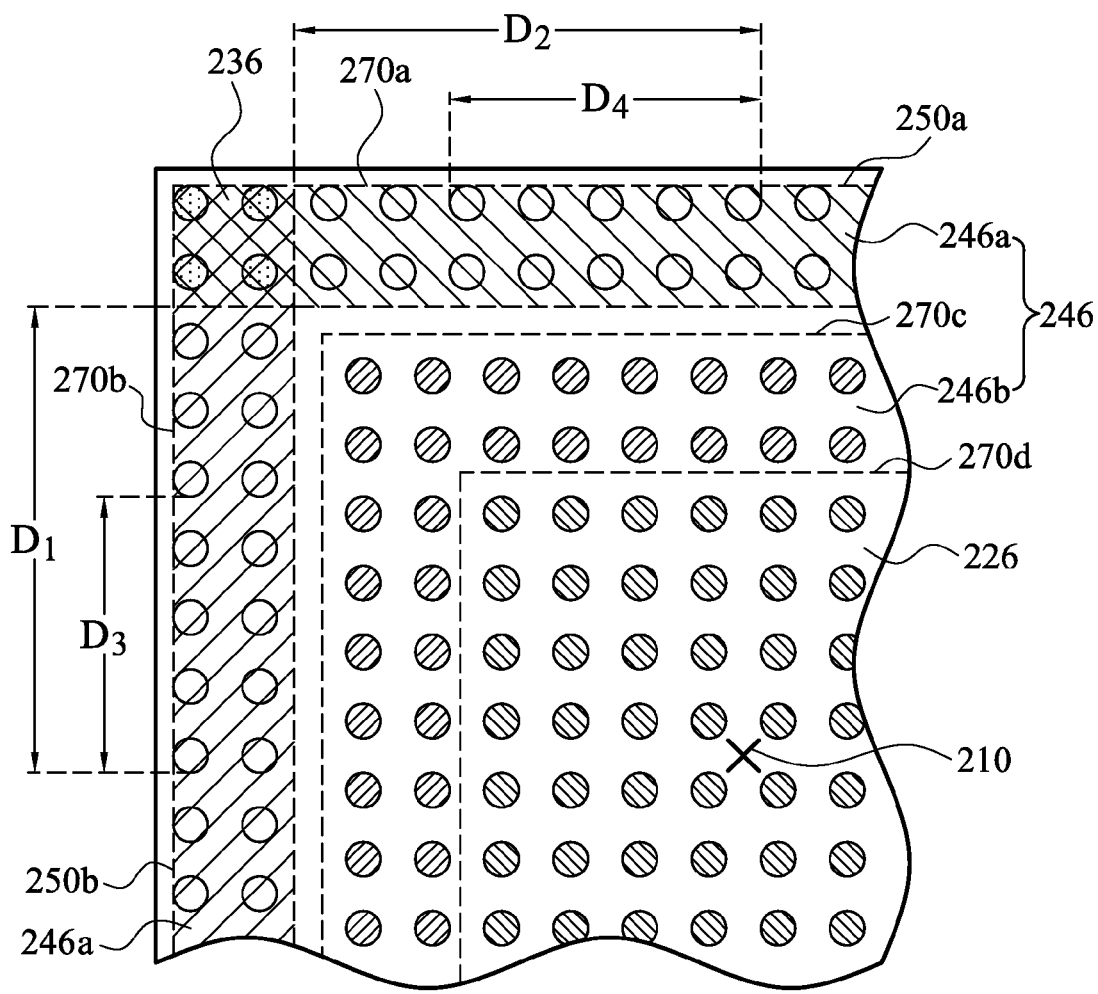

FIG. 2D is a top view of a portion of a bump layout for a semiconductor chip according to some embodiments. The bump positions are grouped according to a central region 226, a corner region 236, and a peripheral region 246. The peripheral region 246 is subdivided into a first peripheral region 246a and a second peripheral region 246b.

Various regions are defined by UBM bonding edges 250a/250b or rectangle regions 270a/270b/270c/270d. For example, the corner region 236 is defined as an overlapped region of the rectangle region 270a and rectangle region 270b. Rectangle region 270a is defined as the region between a UBM bonding edge 250a and a side having a distance D1 from the geometric center 210; and rectangle region 270b is defined as the region between a UBM bonding edge 250b and a side having a distance D2 from the geometric center 210.

The first peripheral region 246a is defined as the combined region of the rectangle regions 270a and 270b, less the corner region 236. The second peripheral region 246b is defined as the differences of the rectangle region 270c and the rectangle region 270d. Rectangle region 270c is defined by sides having a distance D1 from the geometric center 210 in a vertical direction and a distance D2 from the geometric center 210 in a horizontal direction; and rectangle region 270d is defined by sides having a distance D3 from the geometric center 210 in a vertical direction and a distance D2 from the geometric center 210 in a horizontal direction.

The region in which the geometric center 210 sits and is not defined as corner region 236 and peripheral region 246 which is defined as the central region 226.

Although only a portion of the bump layout 200 is illustrated in FIGS. 2C-2D, regions in other portions of the bump layout are similarly defined, as well. In addition, in some embodiments, various regions for grouping the bump positions are defined using a combined method in view of the embodiments depicted in FIGS. 2B-2D.

In the embodiments depicted in FIGS. 2B-2D, the conductive pads and bump structures formed in a region closer to the geometric center 210 have a greater pad width, or a higher pad width to UBM width ratio. For example, in some embodiments, the UBM structures in the semiconductor chip have the same UBM width of 85 µm. The lateral edge-to-edge distance of the conductive pads positioned in the central region 220/222/224/226 is 2 µm; the lateral edge-to-edge distance of the conductive pads positioned in the peripheral region 240/242/244/246 is 3.5 µm; and the lateral edge-to-edge distance of the conductive pads positioned in the corner region 230/232/234/236 is 5 µm.

Figure 3:
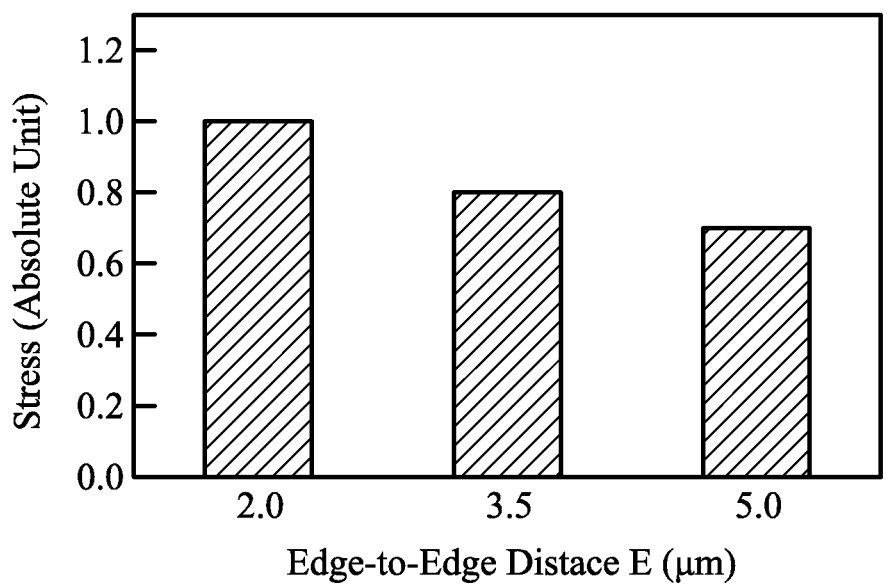
FIG. 3 is chart of the relationship between the size of conductive pads and the stress imposed on a dielectric layer based on simulated data.

FIG. 3 is chart of the relationship between the size of conductive pads and stress imposed on a dielectric layer based on simulated data. As the size of the contact pad increases, the stress on the dielectric layers decreases. For example, in a given scenario when the width X of the UBM structures is fixed and the lateral edge-to-edge distance E of the conductive pad is 2.0 µm, the stress on the dielectric layers is defined as 1.0 (absolute unit). Given a lateral edge-to-edge distance E is 3.5 µm, the stress on the dielectric layer decreases from 1.0 to 0.8, representing a 20% reduction in stress. Given a lateral edge-to-edge distance E is 5.0 µm, the stress on the dielectric layer decreases from 1.0 to 0.7, representing a 30% reduction.

A person of ordinary skill in the art, in view of the present disclosure, will appreciate that the determination of the UBM widths and pad widths is dependent on requirements of different manufacturing and/or packaging processes. In some embodiments, further increasing the pad size or pad width to UBM width ratio does not guarantee the same percentage of improvement in the stress reduction on the dielectric layers. Also, the conductive layer used to form the conductive pads is also used for signal path routing purposes. Therefore, a person of ordinary skill in the art will appreciate that the various pad sizes or pad width to UBM width ratios for the semiconductor chip is determined by balancing the stress level or the yield rate of the semiconductor chip and the areas occupied by the conductive pads.

Figure 4:
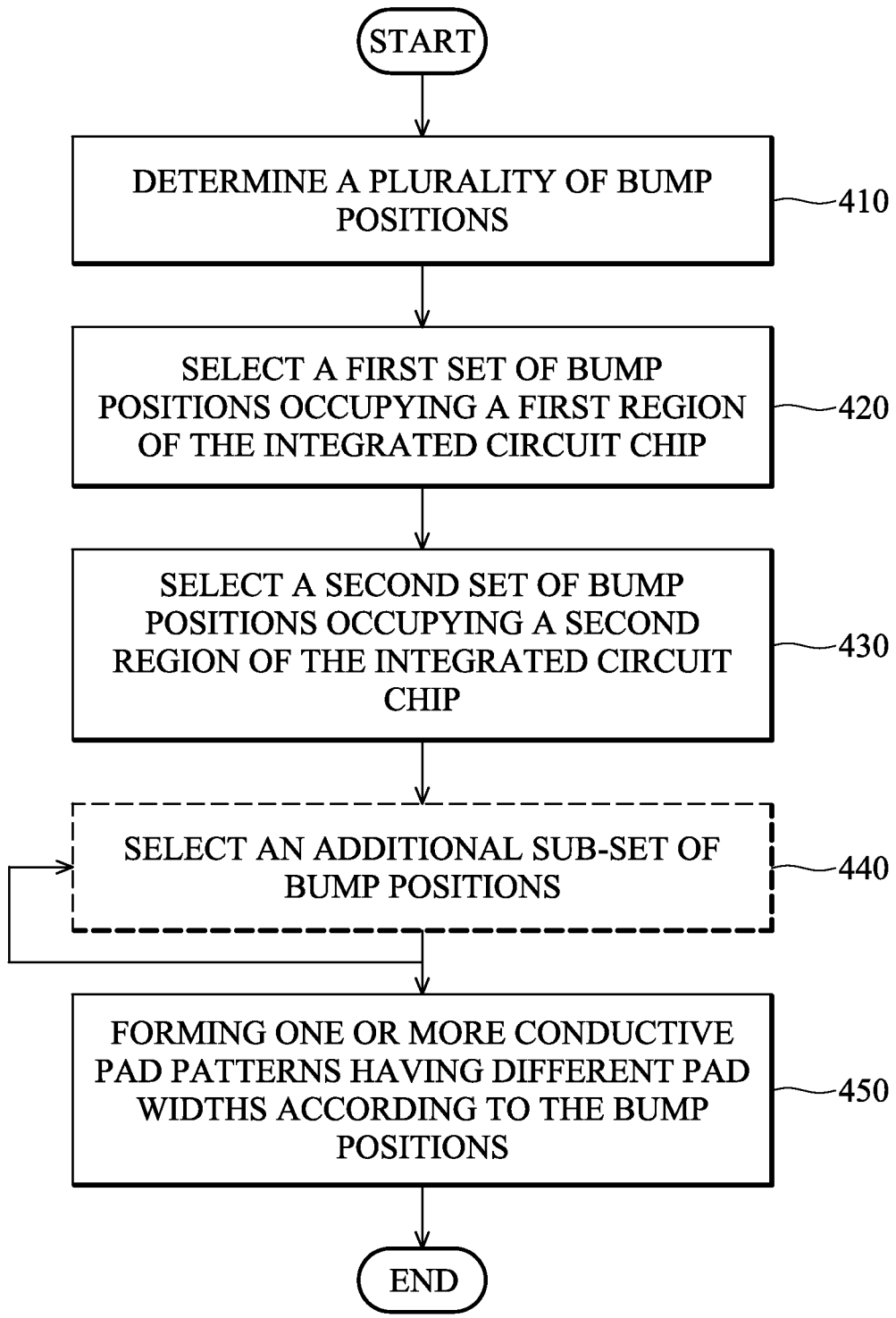
FIG. 4 is a flow chart of a method of preparing a layout for manufacturing a semiconductor chip according to some embodiments.

FIG. 4 is a flow chart of a method of preparing a layout for manufacturing a semiconductor chip according to some embodiments. A person of ordinary skill in the art will appreciate that, in some embodiments, additional operations are performed before, during, and/or after the method depicted in FIG. 4. Further, the disclosed operations may be added, replaced, changed order, and/or eliminated as appropriate, in accordance with the spirit and scope of the present disclosure.

In operation 410, a plurality of bump positions is determined according to a circuit design and requirements associated with a particular manufacturing process and/or packaging process by operating a layout editing tool or an EDA tool. Then, in operation 420, a first set of bump positions occupying a first region of the semiconductor chip is selected, and subsequently, in operation 430, a second set of bump positions occupying a second region of the semiconductor chip is determined.

Each one of the bump positions denotes a location for forming a conductive pad pattern and a corresponding under bump metallurgy (UBM) pattern for manufacturing the conductive pad and the UBM structure of the semiconductor chip. In some embodiments, conductive pads corresponding to the same set of bump positions have substantially the same pad width, and UBM structures corresponding to the same set of bump positions have substantially the same UBM width. In the present embodiment, the second region is farther from a geometric center of the semiconductor chip than the first region. In some embodiments, the farther the region of the set of bump positions, the greater the pad width or the pad width to UBM width ratio.

In an optional operation 440, an additional sub-set of bump positions is selected. For example, in the embodiment depicted in FIG. 2B, a corner region 230 is subdivided into a first corner region 230*a* and a second corner region 230*b*. As such, sub-sets of bump positions are selected based on the region where the bump positions are located. In some embodiments, operation 440 is performed cyclically until the bump layout is divided into regions according to a predetermined strategy and the bump positions are grouped according to where the bump positions are located.

Subsequently, in operation 450, one or more conductive pad patterns and corresponding UBM patterns, having a first pad width to UBM width ratio, are formed at the first set of bump positions; and one or more conductive pad patterns and corresponding UBM patterns, having a second pad width to UBM width ratio greater than the first ratio, are formed at the second set of bump positions.

Each one of the UBM patterns has a shape similar to a corresponding conductive pad pattern and defines a lateral edge-to-edge distance between the UBM pattern and the conductive pad pattern. In some embodiments, the lateral edge-to-edge distance ranges from 1 μm to 12 μm. In at least one embodiment, a first lateral edge-to-edge distance for a UBM and a conductive pad formed at the first set of bump positions is 2 μm, and a second lateral edge-to-edge distance for a UBM and a conductive pad formed at the second set of bump positions is not less than 4 μm.

Various approaches are applicable for determining the regions and selecting the bump positions. In some embodiments, as depicted in FIG. 2B, the selection of the second set of bump positions is performed by first defining a right triangle region and then selecting bump positions within the right triangle region are selected as the second set of bump positions.

In some embodiments, as depicted in FIG. 2C, the selection of the second set of bump positions is performed by first defining a region enclosed by a first leg extending along a first UBM bonding edge, a second leg extending along a second UBM bonding edge, and an arc having a distance to the geometric center. In yet some other embodiments, as depicted in FIG. 2D, the selection of the second set of bump positions is performed by first defining an overlapping region of two rectangle regions along the UBM bonding edges.

In some embodiments, the operation 440 includes selecting a third set of bump positions occupying a third region of the semiconductor chip. The third region being farther from the geometric center than the first region and closer to the geometric center than the second region. Also, the conductive patterns and the bump structure patens corresponding to the third set of bump positions have a third pad width to UBM width ratio that is greater than the first ratio and smaller than the second ratio.

Various approaches are applicable for determining the regions and selecting the bump positions. In some embodiments, as depicted in FIG. 2B, the selection of the third set of bump positions is performed by first defining a first right triangle region and a second right triangle region, and then defining a trapezoid region based on the difference of the first right triangle region and the second right triangle region.

In some alternative embodiments, as depicted in FIG. 2B, the selection of the third set of bump positions is performed by first defining a first right triangle region and a second triangle region, and then defining a rectangle region having a first side offset from the first UBM bonding edge for a first distance and a second side offset from the first UBM bonding edge for a second distance. Finally, bump positions within the rectangular region but not within the first and second right triangle regions are selected as the third set of bump positions.

In some embodiments, as depicted in FIG. 2C, the selection of the third set of bump positions is performed by defining a region between a first arc having a first distance to the geometric center and a second arc having a second distance to the geometric center. In yet some embodiments, as depicted in FIG. 2D, the selection of the third set of bump positions is performed by defining a region between a first rectangle region enclosing the geometric center and a second square rectangular region enclosing the first rectangle region.

Figure 5:
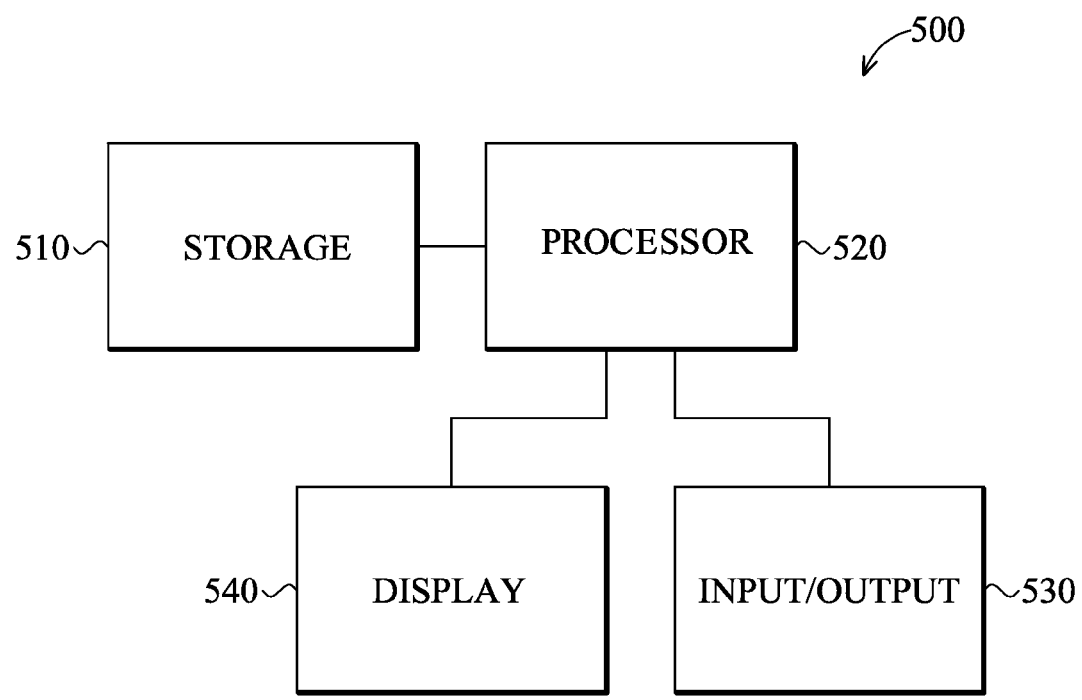
FIG. 5 is a high-level functional block diagram of a computer system usable in conjunction with a method according to an embodiment.

FIG. 5 is a high-level functional block diagram of a computer system 500 for implementing a method for preparing a layout according to an embodiment. Computer system 500 includes a computer readable storage medium 510 encoded with, i.e., storing, a computer program code, i.e., a set of executable instructions. The computer system 500 includes a processor 520 electrically coupled to the computer readable storage medium 510. The processor 520 is configured to execute the computer program code encoded in the computer readable storage medium 510 in order to cause the computer system 500 to function as a layout editing tool or an EDA tool for performing the method depicted in FIG. 4.

In some embodiments, the processor 520 is a central processing unit (CPU), a multi-processor, a distributed processing system, and/or any suitable processing unit.

In some embodiments, the computer readable storage medium 510 is an electronic, magnetic, optical, electromagnetic, infrared, and/or a semiconductor system (or apparatus or device). For example, the computer readable storage medium 510 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 510 includes a compact disk-read only memory (CD-ROM), a compact disk-read/write (CD-R/W), and/or a digital video disc (DVD).

Further, the computer system includes an input/output interface 530 and a display 540. The input/output interface 530 is coupled to the processor 520 and allows a layout engineer or a circuit engineer to operate the computer system 500 in order to perform the methods depicted in FIG. 4. The display 540 displays the status of operation of the methods depicted in FIG. 4 in a real-time manner, and preferably provides a Graphical User Interface (GUI). The input/output interface 430 and the display 440 allow an operator to operate the computer system 400 in an interactive manner.

As explained above, in some embodiments, by increasing the pad width of the conductive pads or the pad width to UBM width ratio, bump cracks and/or fractures and delamination in the dielectric layers of substrate are reduced. Also, the lifetime of the semiconductor chip package is improved.

Although the present disclosure and its advantages have been described in detail, it should be understood that various changes, substitutions and alterations can be made herein without departing from the spirit and scope of the disclosure. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure.

What is claimed is:

1. A semiconductor chip, comprising:
a substrate;
a circuit formed over the substrate;
a plurality of conductive pads formed over the substrate, the plurality of conductive pads comprising:
a first conductive pad having a first pad width, the first conductive pad being electrically coupled to the circuit; and
a second conductive pad having a second pad width larger than the first pad width, the second conductive pad being positioned at a corner region of the semiconductor chip and free from being electrically coupled to the circuit, the first conductive pad being positioned closer to a geometric center of the semiconductor chip than the second conductive pad; and
a plurality of bump structures each formed over a corresponding one of the plurality of conductive pads, wherein the plurality of bump structures comprise:
a first bump structure having a first under bump metallurgy (UBM) structure formed over the first conductive pad, the first conductive pad having a size greater than the first UBM structure, and the first UBM structure and the first conductive pad being arranged to define a first lateral edge-to-edge distance; and
a second bump structure having a second UBM structure formed over the second conductive pad, the second UBM structure and the second conductive pad being arranged to define a second lateral edge-to-edge distance larger than the first lateral edge-to-edge distance.

2. The semiconductor chip of claim 1, wherein the pad width of the plurality of conductive pads increases in relation to a distance of the conductive pad from the geometric center.

3. The semiconductor chip of claim 1, wherein the plurality of conductive pads is arranged into a plurality of groups, and conductive pads within one of the groups have substantially the same pad width.

4. The semiconductor chip of claim 3, wherein the plurality of groups comprises:
a first group including conductive pads having the first pad width and being positioned in a central region of the semiconductor chip; and
a second group including conductive pads having the second pad width and being positioned in the corner region of the semiconductor chip.

5. The semiconductor chip of claim 4, wherein the plurality of groups further comprises:
a third group including conductive pads having a third pad width in a peripheral region of the semiconductor chip, the third pad width being greater than the first pad width and smaller than the second pad width.

6. The semiconductor chip of claim 1, wherein the first conductive pad has a shape similar to that of the first UBM structure and the second conductive pad has a shape similar to the second UBM structure and a size greater than that of the first UBM structure.

7. The semiconductor chip of claim 1, wherein the first lateral edge-to-edge distance and the second lateral edge-to-edge distance range from 1 μm to 12 μm.

8. A method of preparing a layout for manufacturing a semiconductor chip, comprising:
determining a plurality of bump positions;
selecting a first set of bump positions occupying a first region of the semiconductor chip;
selecting a second set of bump positions occupying a second region of the semiconductor chip, the second region being farther from a geometric center of the semiconductor chip than the first region;
forming one or more first conductive pad patterns and corresponding first under bump metallurgy (UBM) patterns having a first pad width to UBM width ratio at the first set of bump positions, each first conductive pad pattern having a shape similar to the corresponding first UBM pattern and a size greater than that of the corresponding first UBM pattern; and
forming one or more second conductive pad patterns and corresponding second UBM patterns, having a second pad width to UBM width ratio greater than the first ratio, at the second set of bump positions, each second conductive pad pattern having a shape similar to the corresponding second UBM pattern and a size greater than that of the corresponding second UBM pattern,
wherein the second pad width of at least one of the one or more second conductive pad patterns is greater than the first pad width of at least one of the one or more first conductive pad patterns.

9. The method of claim 8, wherein each first conductive pad pattern and the corresponding first UBM pattern has a lateral edge-to-edge distance ranging from 1 μm to 12 μm.

10. The method of claim 8, wherein the selection of the second set of bump positions comprises:
defining a right triangle region having a first leg extending along a first UBM bonding edge and a second leg extending along a second UBM bonding edge, the first leg and the second leg having a predetermined leg length; and
selecting bump positions within the right triangle region as the second set of bump positions.

11. The method of claim 8, wherein the selection of the second set of bump positions comprises:
defining a region enclosed by a first leg extending along a first UBM bonding edge and a second leg extending along a second UBM bonding edge, and an arc having a distance to the geometric center; and
selecting bump positions within the region as the second set of bump positions.

12. The method of claim 8, further comprising:
selecting a third set of bump positions occupying a third region of the semiconductor chip; the third region being farther from the geometric center than the first region and closer to the geometric center than the second region; and
forming one or more conductive pad patterns and corresponding UBM patterns, having a third pad width to UBM width ratio, at the third set of bumps positions, the third ratio being greater than the first ratio and smaller than the second ratio.

13. The method of claim 12, wherein the selection of the third set of bump positions comprises:
defining a first right triangle region having a first leg extending along a first UBM bonding edge and a second leg extending along a second UBM bonding edge, the first leg and the second leg having a first predetermined leg length;
defining a second right triangle region having a third leg extending along the first UBM bonding edge and a fourth leg extending along the second UBM bonding edge, the third leg and the fourth leg having a second predetermined leg length greater than the first predetermined leg length;

defining a trapezoid region based on the difference of the first right triangle region and the second right triangle region; and selecting bump positions within the trapezoid region as the third set of bump positions.

14. The method of claim 12, wherein the selection of the third set of bump positions comprises:

defining a first right triangle region having a first leg extending along a first UBM bonding edge and a second leg extending along a second UBM bonding edge, the first leg and the second leg having a first predetermined leg length;

defining a second right triangle region having a third leg extending along the first UBM bonding edge and a fourth leg extending along a third UBM bonding edge, the third leg and the fourth leg having the first predetermined leg length;

defining a rectangular region having a first side offset from the first UBM bonding edge for a first distance and a second side offset from the first UBM bonding edge for a second distance; and selecting bump positions within the rectangular region but not within the first and second right triangle regions as the third set of bump positions.

15. The method of claim 12, wherein the selection of the third set of bump positions comprises:

defining a region between a first arc having a first distance to the geometric center and a second arc having a second distance to the geometric center; and selecting bump positions within the region as the third set of bump positions.

16. The method of claim 12, wherein the selection of the third set of bump positions comprises:

defining a region between a first rectangle region enclosing the geometric center and a second square rectangular region enclosing the first rectangle region; and selecting bump positions within the region as the third set of bump positions.

17. A semiconductor chip, comprising:

a substrate;

a first conductive pad formed over the substrate;

a first under bump metallurgy (UBM) structure formed over the first conductive pad, the first conductive pad and the first UBM structure has a first pad width to UBM width ratio, the first conductive pad having a shape similar to the first UBM structure and a size greater than that of the first UBM structure;

a second conductive pad formed over the substrate and positioned farther from a geometric center of the semiconductor chip than the first conductive pad; and a second UBM structure formed over the second conductive pad, the second conductive pad and the second UBM structure has a second pad width to UBM width ratio greater than the first ratio, the second conductive pad having a shape similar to the second UBM structure and a size greater than that of the second UBM structure, wherein the second pad width is different from the first pad width.

18. The semiconductor chip of claim 17, further comprising:

a third conductive pad formed over the substrate and positioned farther from the geometric center than the first conductive pad and closer to the geometric center than the second conductive pad; and a third UBM structure formed over the third conductive pad, the third conductive pad and the third UBM structure has a third pad width to UBM width ratio greater than the first ratio and smaller than the second ratio.

19. The semiconductor chip of claim 17, wherein:

the first UBM structure and the first conductive pad are positioned to have a lateral edge-to-edge distance equal 2 µm; and the second UBM structure and the second conductive pad are positioned to have a lateral edge-to-edge distance no less than 4 µm.

20. The semiconductor chip of claim 17, wherein the first UBM structure and the first conductive pad are positioned to have a lateral edge-to-edge distance ranging from 1 µm to 12 µm; and the second UBM structure and the second conductive pad are positioned to have a lateral edge-to-edge distance ranging from 1 µm to 12 µm.

* * * * *